(12) United States Patent
Lu et al.

(10) Patent No.: US 7,582,538 B2
(45) Date of Patent: Sep. 1, 2009

(54) METHOD OF OVERLAY MEASUREMENT FOR ALIGNMENT OF PATTERNS IN SEMICONDUCTOR MANUFACTURING

(75) Inventors: Hsiao-Tzu Lu, Hsin-chu (TW); Chin-Hsiang Lin, Hsin-chu (TW); Hua-Shu Wu, Hsin-chu (TW); Chia-Hsiang Lin, Hsin-Chu (TW); Kuei Shun Chen, Hsin-Chu (TW)

(73) Assignee: Taiwan Semiconductor Manufacturing Company, Ltd., Hsin-Chu (TW)

( * ) Notice: Subject to any disclaimer, the term of this patent is extended or adjusted under 35 U.S.C. 154(b) by 736 days.

(21) Appl. No.: 11/099,966

(22) Filed: Apr. 6, 2005

(65) Prior Publication Data
US 2006/0228816 A1 Oct. 12, 2006

(51) Int. Cl.
*H01L 21/76* (2006.01)

(52) U.S. Cl. .............................. 438/401; 257/E23.179

(58) Field of Classification Search ................. 438/401
See application file for complete search history.

(56) References Cited

U.S. PATENT DOCUMENTS

| 4,172,664 | A |   | 10/1979 | Charsky et al. |
|---|---|---|---|---|
| 5,604,344 | A | * | 2/1997 | Finarov ................... 250/201.3 |
| 6,093,640 | A |   | 7/2000 | Hsu et al. |
| 6,118,185 | A |   | 9/2000 | Chen et al. |
| 2003/0174879 | A1 | * | 9/2003 | Chen .......................... 382/151 |
| 2003/0223630 | A1 | * | 12/2003 | Adel et al. .................. 382/145 |
| 2004/0191652 | A1 | * | 9/2004 | Dishon et al. ................. 430/30 |
| 2005/0195398 | A1 | * | 9/2005 | Adel et al. ................... 356/401 |

* cited by examiner

*Primary Examiner*—Thanh Nguyen
(74) *Attorney, Agent, or Firm*—Haynes and Boone, LLP

(57) ABSTRACT

A method for semiconductor manufacturing includes forming an overlay target having a pattern formed by a first mask layer and an adjacent layer. The overlay target is exposed to radiation. As a result, reflective beams can be detected from the pattern and the adjacent layer and the location of the pattern can be identified based on the reflective beams.

29 Claims, 5 Drawing Sheets

METHOD OF OVERLAY MEASUREMENT FOR ALIGNMENT OF PATTERNS IN SEMICONDUCTOR MANUFACTURING

CROSS-REFERENCE

The present application is related to U.S. Pat. No. 6,093,640 to Hsu et al. and U.S. Pat. No. 6,118,185 to Chen et al., each of which is hereby incorporated by reference in its entirety.

BACKGROUND

The present disclosure relates generally to the manufacturing of semiconductor devices, and more particularly to a system and method for overlay measurement in semiconductor manufacturing.

The semiconductor integrated circuit (IC) industry has experienced rapid growth. Technological advances in IC materials and design have produced generations of ICs where each generation has smaller feature sizes and more complex circuits than those from the previous generation.

Currently, semiconductor devices are fabricated by patterning a sequence of patterned and un-patterned layers, and the features on successive patterned layers are spatially related to each another. During the fabrication, each patterned layer must be aligned with the previous patterned layers with a degree of precision. Therefore, pattern recognition is a key part of successful photolithography.

Conventional pattern recognition is done by a pattern alignment technique. A lower (previous) patterned layer will include an overlay target, and a second pattern on an upper (next) patterned layer can then be aligned. However, this alignment technique can provide difficulties in recognizing the overlay target, especially in fabrication techniques such as damascene or dual damascene. Techniques other than damascene or dual damascene processes also experience such difficulties.

BRIEF DESCRIPTION OF THE DRAWINGS

Aspects of the present disclosure are best understood from the following detailed description when read with the accompanying figures. It is emphasized that, in accordance with the standard practice in the industry, various features are not drawn to scale. In fact, the dimensions of the various features may be arbitrarily increased or reduced for clarity of discussion.

DETAILED DESCRIPTION

Figure 1A:
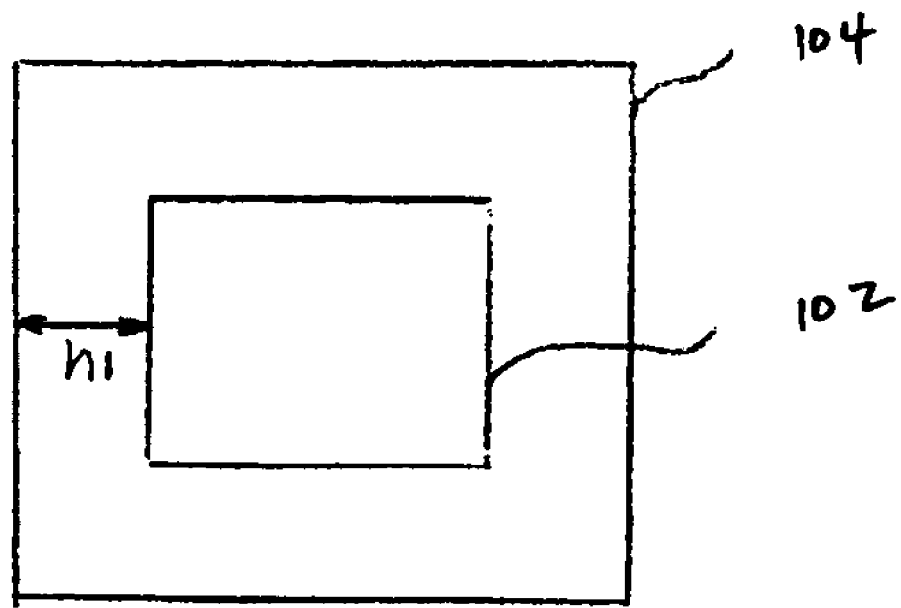
FIG. 1a illustrates a box-in-box alignment pattern according to one or more embodiments of the present invention.

It is to be understood that the following disclosure provides many different embodiments, or examples, for implementing different features of the disclosure. Specific examples of components and arrangements are described below to simplify the present disclosure. These are, of course, merely examples and are not intended to be limiting. In addition, the present disclosure may repeat reference numerals and/or letters in the various examples. This repetition is for the purpose of simplicity and clarity and does not in itself dictate a relationship between the various embodiments and/or configurations discussed. Moreover, the formation of a first feature over or on a second feature in the description that follows may include embodiments in which the first and second features are formed in direct contact, and may also include embodiments in which additional features may be formed interposing the first and second features, such that the first and second features may not be in direct contact.

An improved pattern recognition technique as herein provided takes advantage of a difference in reflectivity from a first and its adjacent dielectric layer, as they are formed by different materials. By detecting the different reflectance from the outer box and its adjacent dielectric layer, the precise location of the outer box may be identified.

Referring to FIG. 1a, a box-in-box pattern recognition technique according to the present embodiments utilizes an inner box 102 for aligning with an overlay target 104. In the present example, the overlay target is shown as an outer box. For the sake of example, the outer box 104 can be formed in a lower (previous) patterned layer and the inner box 102 will be formed in an upper (next) patterned layer. There may be one or more un-patterned layers between the two.

In one example, a width of the outer box 104 may be in the range of between about 10 um and about 40 um, while a width of the inner box 102 may be between about 5 um and about 30 um. As a result, a distance h1 between the boxes 102 and 104 may be between about 5 um and about 20 um. It is noted that other sizes of the boxes 102 and 104 are also contemplated by the present disclosure. Also, it is understood that the use of boxes is for the sake of example, and other patterns such as triangles, rectangles, circles, and pluses could also be used.

Figure 1B:
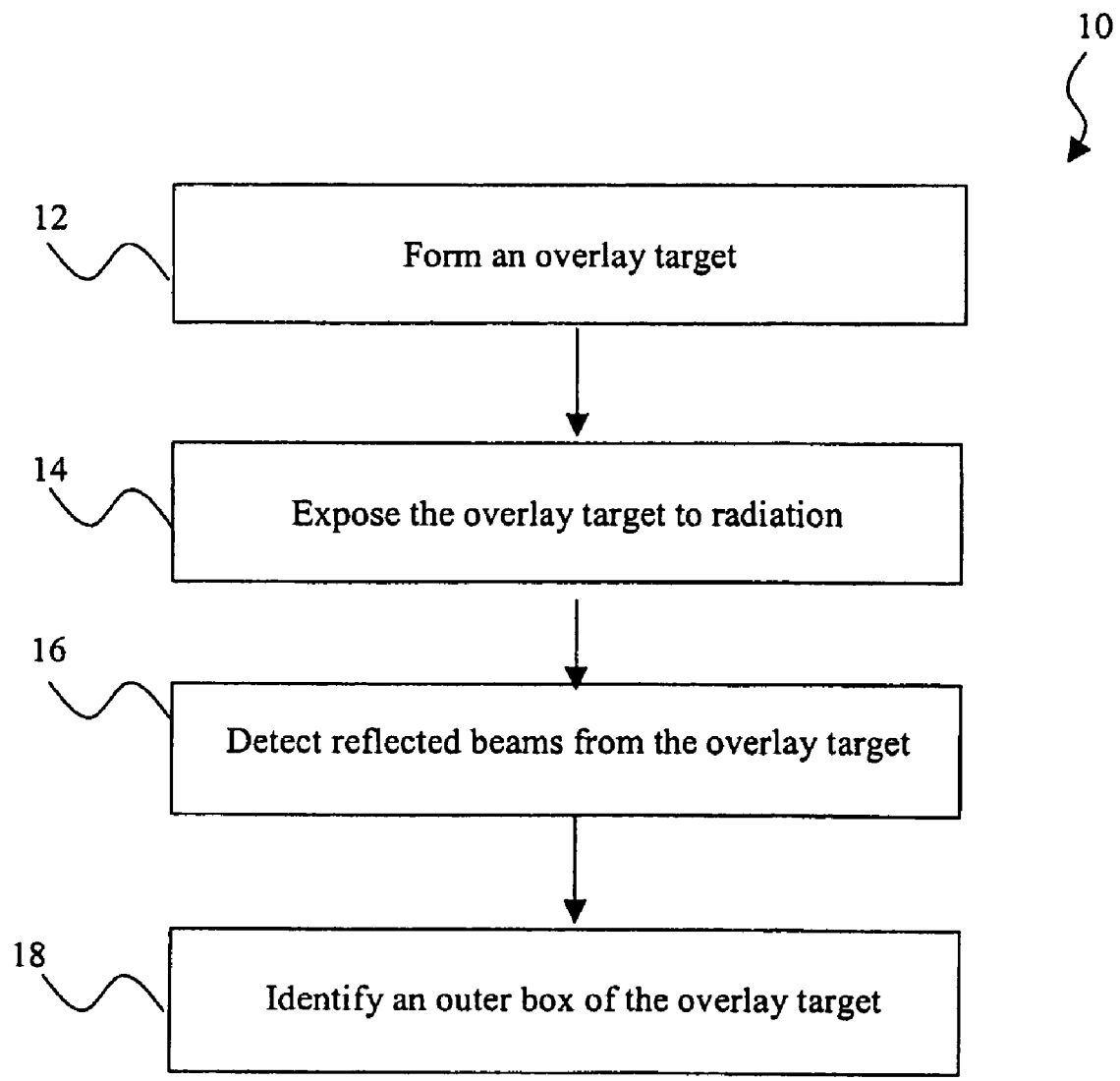
FIG. 1b illustrates a method of overlay measurement according to one or more embodiments of the present invention.

Referring now to FIG. 1b, an exemplary method 10 for overlay measurement initiates with step 12, which forms an overlay target. Pursuant to step 14, the overlay target is exposed to radiation. Then, pursuant to step 16, reflective beams are detected from the overlay target, and the outer box 104 (FIG. 1a) is recognized pursuant to step 18 of the method 10. Once the outer box 104 is recognized, the placement of the inner box 102 can be aligned accordingly.

The method 10 may be utilized in the manufacturing of a variety of semiconductor devices (with or without the damascene technology), such as memory devices (including but not limited to a static random access memory (SRAM)), logic devices (including but not limited to a metal-oxide semiconductor field-effect transistor (MOSFET)), and/or other devices. The method 10 will be further described in connections with exemplary partial semiconductor devices depicted in FIGS. 2a-2b and 3a-3b.

Figure 2A:
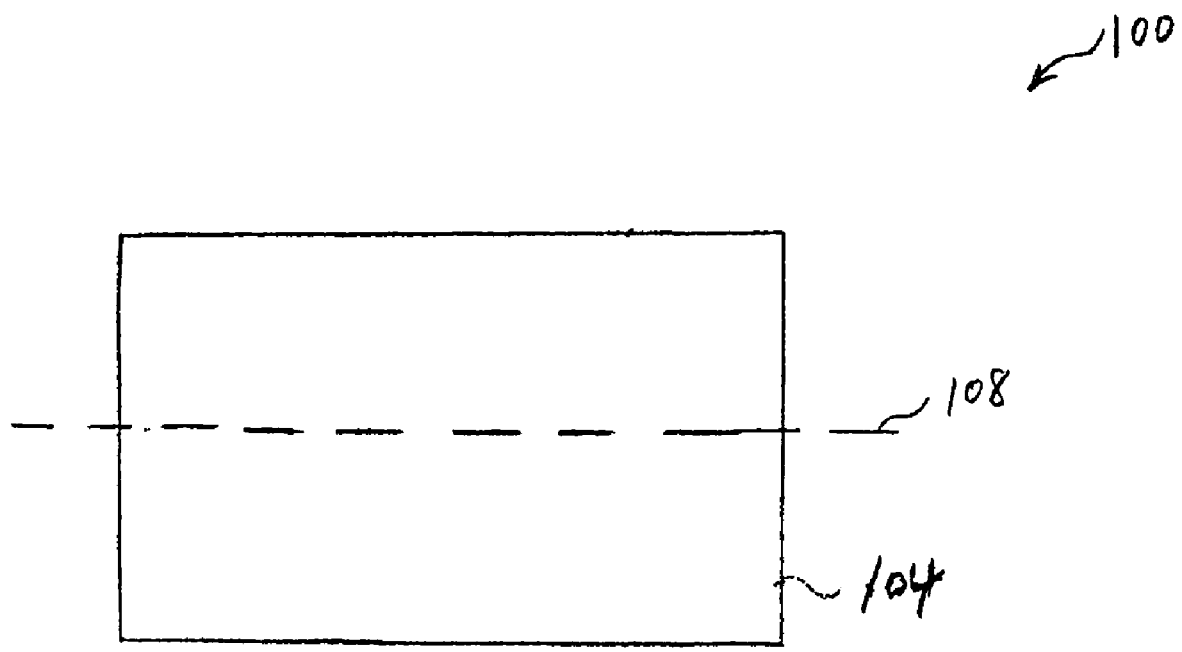
FIGS. 2a-2b illustrate partial semiconductor devices that include overlay targets according to one or more embodiments of the present invention.

Referring now to FIG. 2a, shown therein is an exemplary view of a partial box-in-box alignment pattern 100. In this embodiment, an outer box 104 has already been formed by a first photolithograph process, while an inner box (not shown) is to be formed by a separate second photolithography process.

Figure 2B:
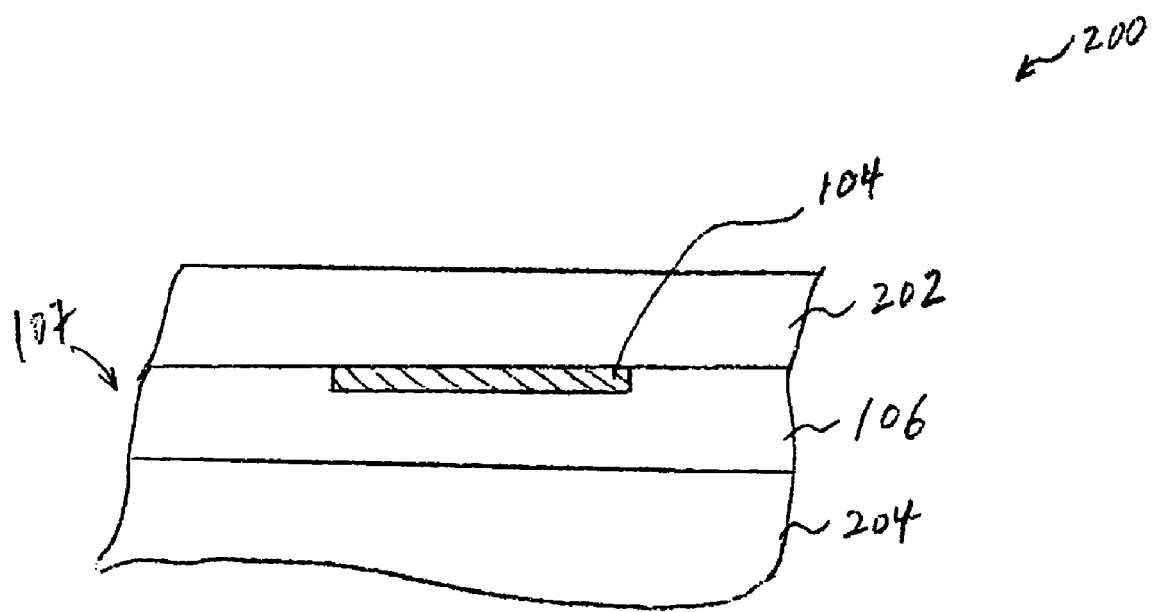

Referring now to FIG. 2b, shown therein is a cross sectional view (along a line 108 of FIG. 1) of a partial semiconductor device 200 that includes the partial box-in-box alignment pattern 100 of FIG. 1. In this embodiment, the partial semiconductor device 200 includes a substrate 204, an overlay target 107 (which includes a dielectric layer 106 and the outer box 104), and an inter-metal dielectric layer 202. The overlay target 107, which includes the dielectric layer 106 and the outer box 104, may be formed pursuant to step 12 of the method 10.

In one example, the substrate 204 may include an elementary semiconductor, such as crystal silicon, polycrystalline silicon, amorphous silicon, and/or germanium; a compound semiconductor, such as silicon carbide and/or gallium arsenic; an alloy semiconductor, such as SiGe, GaAsP, AlInAs, AlGaAs, and/or GaInP. Further, the substrate 204 may include a bulk semiconductor, such as bulk silicon, and such a bulk semiconductor may include an epi silicon layer. It may also or alternatively include a semiconductor-on-insulator substrate, such as a silicon-on-insulator (SOI) substrate, or a thin-film transistor (TFT) substrate. The substrate 204 may also or alternatively include a multiple silicon structure or a multilayer compound semiconductor structure.

In one embodiment, the dielectric layer 106 may be deposited on the surface of the substrate 204 by chemical vapor deposition (CVD), plasma-enhanced CVD (PECVD), physical vapor deposition (PVD), ionized PVD (I-PVD), atomic layer deposition (ALD), spin-on coating and/or other processes. The dielectric layer 106 may include low-k materials, carbon-doped silicon oxide, silicon dioxide, polyimide, spin-on-glass (SOG), fluoride-doped silicate glass (FSG), Black Diamond® (a product of Applied Materials of Santa Clara, Calif.), Xerogel, Aerogel, amorphous fluorinated carbon, and/or other materials. In one example, the low-k materials may be porous, and/or posses a k that is not greater than approximately 2.8.

It is contemplated that the dielectric layer 106 may include either a single layer or multiple layers. In one example, the thickness of the dielectric layer 106 may be approximately between about 100 nm and about 2 um. However, other thicknesses of the dielectric layer 106 are also contemplated by the present disclosure.

The outer box 104 may include an opening formed in the dielectric layer 106 by photolithography, etching, and/or other means. The outer box 104 may be a via hole, a trench, and/or any other opening. The outer box 104 may be filled with one or more plugs, which may include one or more conductive materials, such as aluminum, aluminum alloy, copper, copper alloy, tungsten, and/or other conductive materials.

In one embodiment, one or more contrast enhancing materials may be optionally added to either the dielectric layer 106 or the outer box 104 of the overlay target 107. The one or more contrast enhancing materials may include a variety of materials, such as one or more dyes, and/or other materials. The dyes may include one or more organic and/or inorganic materials. It is contemplated that the one or more contrast enhancing materials may be absorptive and/or reflective.

According to step 14 of the method 10, the overlay target 107 may be exposed to radiation by a suitable generator known in the art. The radiation may be visible, invisible, fluorescent, and/or polarized (which may include a single mode or multiple modes). It is contemplated that the radiation may possess a single wavelength or multiple wavelengths.

In one example, the generator may include an invisible electromagnetic wave generator, which may generate a variety of invisible electromagnetic waves, such as X-ray, ultraviolet (UV), deep ultraviolet (DUV), and/or waves. Again, the generated waves may be fluorescent and/or polarized (which may include a single mode or multiple modes), and may possess a single wavelength or multiple wavelengths.

According to step 16 of the method 10, reflective beams from the overlay target 107 may be detected by a detector, which may include a wavelength dispersive spectrometer, an energy dispersive spectrometer, and/or other detectors. Since the reflective beams from the dielectric layer 106 differ from those from the outer box 104, the location of the outer box 104 may be identified. As a result, an inner box (FIG. 3) may be properly positioned. It is contemplated that step 16 may be accomplished by an inline or off-line overlay target measurement system.

Figure 3:
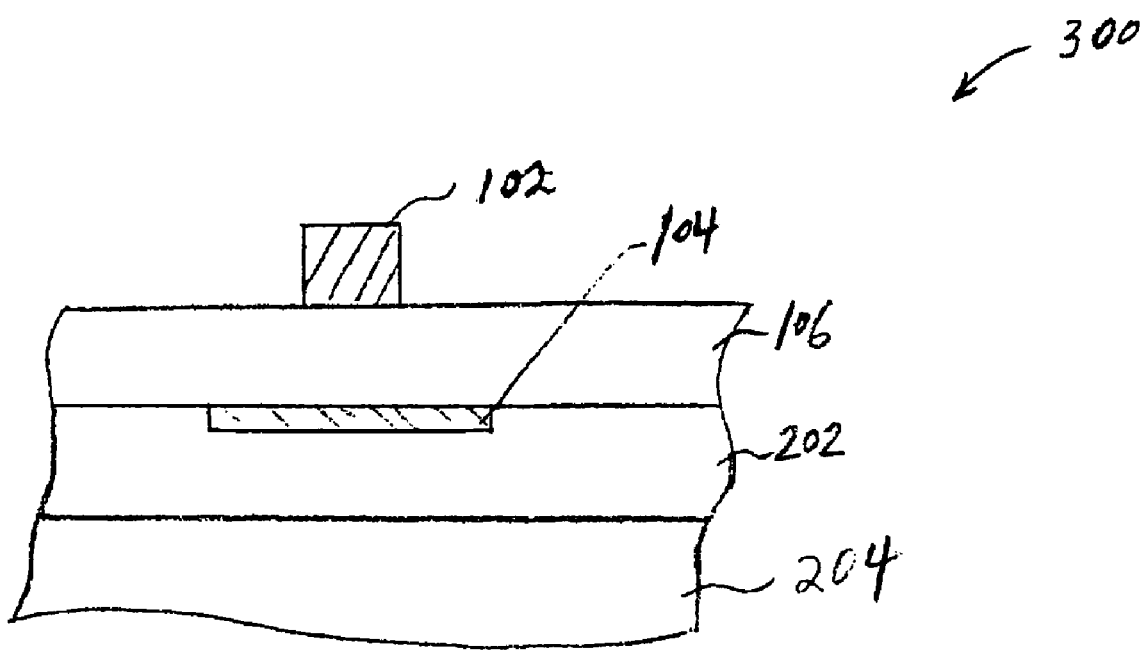
FIG. 3 illustrates a partial semiconductor device that includes overlay targets according to one or more embodiments of the present invention.

Referring now to FIG. 3, shown therein is a further developed partial semiconductor device 300 according to one or more embodiments of the present disclosure. In one embodiment, the partial semiconductor device 300 includes an inner box 102, which is formed during an additional photolithography process by methods known in the art. In this example, the inner box 102 may be a photoresist layer, which may include a positive photoresist, negative photoresist, e-beam resist, and/or other types of resists.

Many variations of the above example are contemplated by the present disclosure. In one example, prior to step 14, instead of adding one or more optional contrast enhancing materials to either the outer box 104 or the dielectric layer 106, a first contrast enhancing material may be added to the outer box 104, while a second contrast enhancing material may be added to the dielectric layer 106. In a second example, the method 10 may be applied to other overlay target designs, such as frame-in-frame, segmented-frame, advanced imaging metrology (AIM), and short vernier (SVNR). In a third example, instead of relying on the different reflective beams from the outer box 104 and the dielectric layer 106, the absence of reflective beams from either of them may be utilized to identify the location of the outer box 104. In a fourth example, in the context of a dual damascene process, a via opening may be formed either before or after the formation of a trench opening. Therefore, a variety of variations are contemplated by the present disclosure.

Although only a few exemplary embodiments of this disclosure have been described in details above, those skilled in the art will readily appreciate that many modifications are possible in the exemplary embodiments without materially departing from the novel teachings and advantages of this disclosure. Also, features illustrated and discussed above with respect to some embodiments can be combined with features illustrated and discussed above with respect to other embodiments. For example, although damascene interconnection is discussed, the present invention can also apply to many different kinds of lithographic processes that do overlay measurements for different layers. Accordingly, all such modifications are intended to be included within the scope of this disclosure.

What is claimed is:

1. A method for semiconductor manufacturing, comprising:

forming an overlay target wherein the overlay target comprises a pattern formed by a feature and an adjacent dielectric layer, and wherein the forming the overlay target including adding a contrast enhancing material to at least one of the feature and the dielectric layer, wherein the contrast enhancing material increases a contrast between the feature and the dielectric layer; and exposing the overlay target to radiation, whereby the radiated overlay target is capable of reflecting beams by which a location of the overlay target can be identified.

2. The method of claim 1 further comprising:

detecting first reflective beams and second reflective beams from the feature and the adjacent dielectric layer, respectively, wherein the first and second reflective beams are different; and identifying the location of the feature based on the first and second reflective beams.

3. The method of claim 2 wherein the detecting is for off-line overlay target measurement.

4. The method of claim 1 wherein the feature is a portion of an outer box of a box-in-box alignment pattern.

5. The method of claim 4 further comprising forming an inner box of the box-in-box alignment pattern, wherein the inner box and the outer box are formed by two separate mask levels.

6. The method of claim 5 wherein the inner box comprises a photoresist layer.

7. The method of claim 4 wherein the feature comprises at least one plug.

8. The method of claim 4 wherein the feature comprises a conductive material.

9. The method of claim 1 wherein the feature comprises at least one trench.

10. The method of claim 1 wherein the overlay target comprises an advanced imaging metrology (AIM) alignment pattern.

11. The method of claim 1 wherein the overlay target comprises a short vernier (SVNR) alignment pattern.

12. The method of claim 1 wherein the adjacent dielectric layer comprises a low-k dielectric layer.

13. The method of claim 1 wherein the adjacent dielectric layer comprises a plurality of layers.

14. The method of claim 1 wherein a thickness of the adjacent dielectric layer is approximately between about 100 nm and about 2 um.

15. The method of claim 1 wherein the radiation is visible.

16. The method of claim 1 wherein the radiation is invisible.

17. The method of claim 1 wherein the radiation is fluorescent.

18. The method of claim 1 wherein the radiation is polarized.

19. The method of claim 1 wherein the radiation comprises a single wavelength.

20. The method of claim 1 wherein the radiation comprises at least one mode.

21. The method of claim 1 wherein the adding the contrast enhancing material to either the pattern or the adjacent dielectric layer includes adding a dye to at least one of the pattern and the adjacent dielectric layer.

22. The method of claim 21 wherein the contrast enhancing material is absorptive.

23. The method of claim 21 wherein the contrast enhancing material is reflective.

24. The method of claim 21 wherein the contrast enhancing material comprises one or more dyes.

25. The method of claim 21 wherein the contrast enhancing material comprises an organic material.

26. The method of claim 21 wherein the contrast enhancing material comprises an inorganic material.

27. The method of claim 21 wherein the pattern comprises a via plug for a dual damascene process.

28. A method for semiconductor manufacturing, comprising:
    forming an overlay target, wherein the overlay target comprises an outer figure for a figure-in-figure alignment pattern and an adjacent dielectric layer, wherein the outer figure comprises a plug including a conductive material;
    adding at least one contrast enhancing material to either the outer figure or the dielectric layer;
    exposing the overlay target to radiation;
    detecting first reflective beams and second reflective beams from the outer figure and the adjacent dielectric layer, respectively, wherein the first and second reflective beams are different;
    identifying the location of the outer figure based on the first and second reflective beams; and
    forming an inner figure for the figure-in-figure alignment pattern, wherein the inner figure and the outer figure are formed by two separate mask levels.

29. The method of claim 28 wherein the at least one contrast enhancing material comprises one or more dyes.

* * * * *